United States Patent
He et al.

(10) Patent No.: US 10,403,804 B2
(45) Date of Patent: Sep. 3, 2019

(54) USING MEMS FABRICATION INCORPORATING INTO LED DEVICE MOUNTING AND ASSEMBLY

(71) Applicants: Epistar Corporation, Hsinchu (TW); IMEC Taiwan Co., Hsinchu (TW)

(72) Inventors: Guan Ru He, Taichung (TW); Jui-Hung Yeh, Chong Li (TW); Kevin T. Y. Huang, Taipei (TW); Chih Chung Chen, Chupei (TW)

(73) Assignees: EPISTAR CORPORATION, Hsinchu (TW); IMEC TAIWAN CO., Hsinchu (TW)

( * ) Notice: Subject to any disclaimer, the term of this patent is extended or adjusted under 35 U.S.C. 154(b) by 0 days.

(21) Appl. No.: 16/006,857

(22) Filed: Jun. 13, 2018

(65) Prior Publication Data
US 2018/0301609 A1    Oct. 18, 2018

Related U.S. Application Data

(63) Continuation of application No. 14/507,862, filed on Oct. 7, 2014, now Pat. No. 10,026,882.

(51) Int. Cl.
*H01L 33/62* (2010.01)
*H01L 25/075* (2006.01)
(Continued)

(52) U.S. Cl.
CPC .......... *H01L 33/62* (2013.01); *H01L 21/6835* (2013.01); *H01L 21/6836* (2013.01); *H01L 24/64* (2013.01); *H01L 24/66* (2013.01); *H01L 24/69* (2013.01); *H01L 24/73* (2013.01); *H01L 24/89* (2013.01); *H01L 24/92* (2013.01);
(Continued)

(58) Field of Classification Search
CPC ....... H01L 33/62; H01L 33/36; H01L 33/486; H01L 33/4805; H01L 33/48
See application file for complete search history.

(56) References Cited

U.S. PATENT DOCUMENTS

2012/0051005 A1   3/2012  Vanfleteren et al.
2012/0097996 A1   4/2012  Lee et al.
(Continued)

FOREIGN PATENT DOCUMENTS

JP    2010226099 A    10/2010

*Primary Examiner* — Michael Carter
(74) *Attorney, Agent, or Firm* — Ding Yu Tan

(57) ABSTRACT

LED chip packaging assembly that facilitates an integrated method for mounting LED chips as a group to be pre-wired to be electrically connected to each other through a pattern of extendable metal wiring lines is provided. LED chips which are electrically connected to each other through extendable metal wiring lines, replace pick and place mounting and the wire bonding processes of the LED chips, respectively. Wafer level MEMS technology is utilized to form parallel wiring lines suspended and connected to various contact pads. Bonding wires connecting the LED chips are made into horizontally arranged extendable metal wiring lines which can be in a spring shape, and allowing for expanding and contracting of the distance between the connected LED chips. A tape is further provided to be bonded to the LED chips, and extended in size to enlarge distance between the LED chips to exceed the one or more prearranged distances.

10 Claims, 12 Drawing Sheets

(51) Int. Cl.
*H01L 21/683* (2006.01)
*H01L 23/00* (2006.01)
*H01L 33/48* (2010.01)
*H01L 33/36* (2010.01)
*H01L 27/15* (2006.01)

(52) U.S. Cl.
CPC .......... *H01L 24/94* (2013.01); *H01L 25/0753* (2013.01); *H01L 24/29* (2013.01); *H01L 24/40* (2013.01); *H01L 24/48* (2013.01); *H01L 24/80* (2013.01); *H01L 24/83* (2013.01); *H01L 24/84* (2013.01); *H01L 24/85* (2013.01); *H01L 27/153* (2013.01); *H01L 33/36* (2013.01); *H01L 33/486* (2013.01); *H01L 2221/6834* (2013.01); *H01L 2221/68304* (2013.01); *H01L 2221/68327* (2013.01); *H01L 2221/68359* (2013.01); *H01L 2221/68372* (2013.01); *H01L 2221/68381* (2013.01); *H01L 2224/29194* (2013.01); *H01L 2224/32* (2013.01); *H01L 2224/40245* (2013.01); *H01L 2224/48091* (2013.01); *H01L 2224/48245* (2013.01); *H01L 2224/64* (2013.01); *H01L 2224/73251* (2013.01); *H01L 2224/80* (2013.01); *H01L 2224/80006* (2013.01); *H01L 2224/8085* (2013.01); *H01L 2224/80862* (2013.01); *H01L 2224/80874* (2013.01); *H01L 2224/84439* (2013.01); *H01L 2224/84444* (2013.01); *H01L 2224/84447* (2013.01); *H01L 2224/84455* (2013.01); *H01L 2224/85439* (2013.01); *H01L 2224/85444* (2013.01); *H01L 2224/85447* (2013.01); *H01L 2224/85455* (2013.01); *H01L 2224/89* (2013.01); *H01L 2224/9222* (2013.01); *H01L 2224/94* (2013.01); *H01L 2924/00014* (2013.01); *H01L 2924/12041* (2013.01); *H01L 2933/0016* (2013.01); *H01L 2933/0066* (2013.01)

(56) References Cited

U.S. PATENT DOCUMENTS

| | | |
|---|---|---|
| 2014/0070235 A1 | 3/2014 | Andrews et al. |
| 2014/0220422 A1 | 8/2014 | Rogers et al. |
| 2015/0255440 A1* | 9/2015 | Hsieh .................. H01L 25/0753 257/88 |

* cited by examiner

USING MEMS FABRICATION INCORPORATING INTO LED DEVICE MOUNTING AND ASSEMBLY

BACKGROUND OF THE INVENTION

(a) Field of the Invention

The present invention is related to a packaging and mounting construction directed to LED chips and more particularly, to an LED packaging and mounting construction using MEMS fabrication techniques for forming LED chips connected by a pattern of extendable metal wiring lines formed there in between and capable of extendably mounting onto a substrate as a group, and an integrated fabrication method thereof.

(b) Description of the Prior Art

LEDs are commonly used for providing illumination because they are compact in size, have a lower power consumption, have a lower operating temperature and have a longer service life, so as to be gradually replacing the conventional tungsten filament bulb and fluorescent lamp. For the fabrication of LED light strings or filaments, many LED chips need to be appropriately placed in accordance with prearranged locations onto a circuit board. Conventionally, the LED chips are individually mounted and placed onto the circuit board by means of an alignment method, such as using a pick-and-place process. Thereafter, wire bonding is performed to create electrical connections between LED chips. The LED chip mounting process can be performed using an LED chip mounter. Drawbacks of conventional methods of LED chip mounting and placement include the fact that the pick-and-place process for mounting individual LED chips is time consuming and requires expensive equipment to perform such tasks. In addition, the wire bonding step to electrically connect the LEDs is also time consuming. Hence, there is a need for improvement in the related art.

SUMMARY OF THE INVENTION

One purpose of the present invention is to provide an LED chip packaging assembly that facilitates an efficient integrated method for mounting a plurality of LED chips as a group. The plurality of LED chips has been pre-wired to be electrically connected to each other through a pattern of extendable metal wiring lines, respectively.

Another purpose of the present invention is to provide a method for mounting a plurality of LED chips as a group at the same time, while the LED chips have already been electrically connected to each other through a preexisting pattern of extendable metal wiring lines. This replaces the need of mounting individual LED chips by means of pick and place mounting process and of the wire bonding process of the LED chips, respectively.

To achieve one of the purposes, a wafer level processing technique under MEMS technology is utilized to form a pattern of parallel wiring lines that are suspended as well as being connected to various contact pads of the LED chips.

To achieve one of the purposes, the bonding wires connecting the LED chips are made into a plurality of extendable metal wiring lines configured in a parallel direction, which can be made in a spring shape. The extendable nature of the extendable metal wiring lines allows increasing and/or decreasing of the distance between the connected LED chips without the extendable metal wiring line being damaged or broken off during usage or mounting.

To achieve one of the purposes, the use of MEMS technology allows fabrication of a large number of extendable metal wiring lines that are suspended and capable of expanding and/or contracting, at the same time on one substrate or one wafer. Thus, embodiments of the present invention thereby efficiently replace the individually wiring bonding of LED chips processes.

To achieve the purpose of replacing the need for using the individual pick and place mounting method for individual LED chips, embodiments of present invention utilize LED chips that are arranged at prearranged distances from one another and can be expanded or extended out in a consistent manner, such as at a constant or variable speed, by making use of a substantially uniform stretching or expanding of a tape to which the LED chips are temporarily bonded with, so as to meet the demands for different size requirements for LED chip layout.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention is illustrated by way of example and not limited by the figures of the accompanying drawings in which same references indicate similar elements. Many aspects of the disclosure can be better understood with reference to the following drawings. Moreover, in the drawings same reference numerals designate corresponding elements throughout. Wherever possible, the same reference numerals are used throughout the drawings to refer to the same or similar elements of an embodiment.

DETAILED DESCRIPTION OF THE PREFERRED EMBODIMENTS

In the illustrated embodiments presented herein, a p-pad and an n-pad for each LED chip can be both on the same side of the LED chip.

Figure 1:
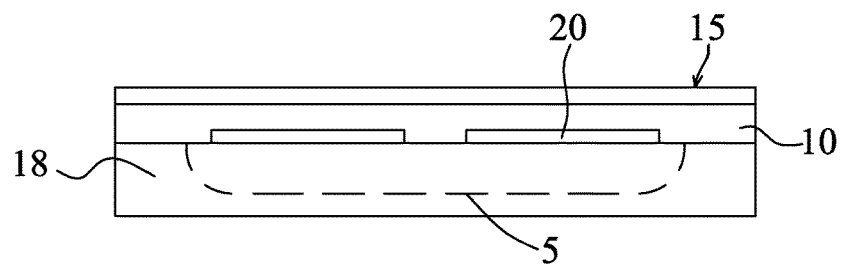
FIGS. 1-7 illustrate a plurality of schematic cross-sectional views of an integrated fabrication method according to a first embodiment of present invention.
Figure 2:
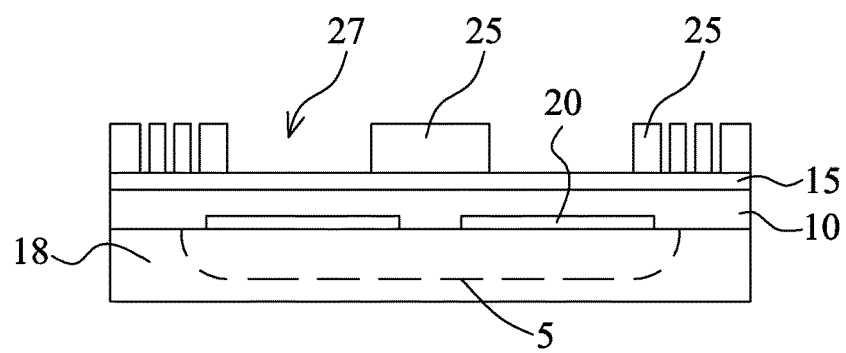

An integrated fabrication method for mounting and electrically connecting a plurality of LED chips according to a first embodiment of present invention is described as follow: Referring to FIG. 1, an LED chip 5 and a plurality of metal layers 10, 15 are both formed on one side of an LED wafer 18. In this embodiment, the metal layer 10 comprises titanium and the metal layer 15 comprises copper. The titanium layer 10 and the copper layer 15 are deposited by e-gun evaporation method, in which the titanium layer 10 is deposited first, and followed by the copper layer 15. In addition, a plurality of bonding pads 20 are formed on the LED chip 5. Referring to FIG. 2, a photoresist layer 25 is formed to cover the top of the metal layers (Ti/Cu) 10, 15. The photoresist layer 25 can be a negative resist, and the developer used can be an organic solvent. The photoresist layer 25 is then developed and exposed by a photomask and the unexposed region of the negative photoresist is dissolved away by the solvent. The photomask (not shown) is designed to have a (solid) pattern of a plurality of extendable metal wiring lines and a plurality of contacting electrodes. After developing and exposure steps, the patterns on the photomask (not shown in the figure) is transferred onto a patterned photoresist layer 25 so that the patterned photoresist layer 25 then serves as a mask itself in later processing. The removed portions of the patterned photoresist layer 25 are referred to as openings 27. In another embodiment, the photoresist layer 25 can be a positive resist, and the photomask can be the pattern of a plurality of extendable metal wiring lines and a plurality of contacting electrodes being of opening region (exposed region). Plasma etching can be performed while using the photomask to form the patterned photoresist layer 25 as shown in FIG. 2.

Figure 3:
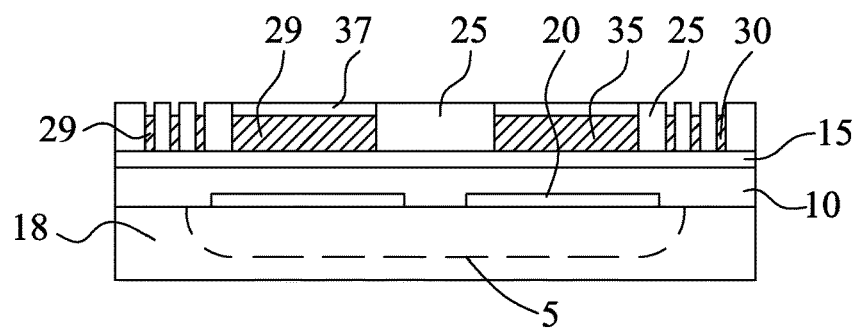
Figure 4:
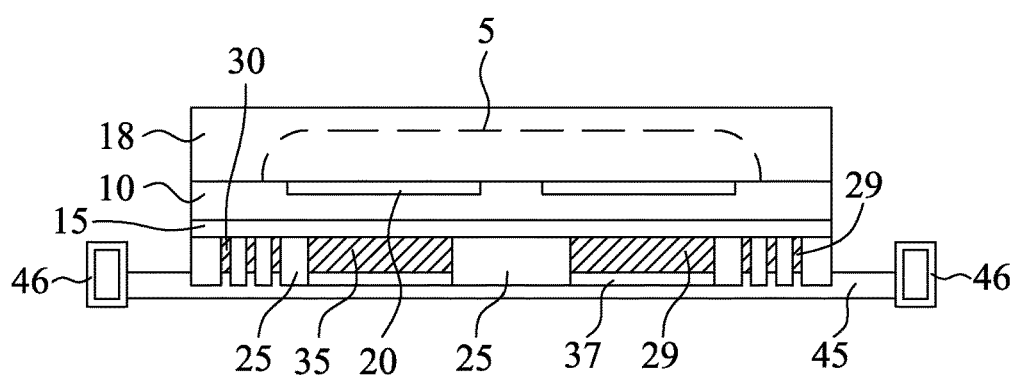
Figure 5:
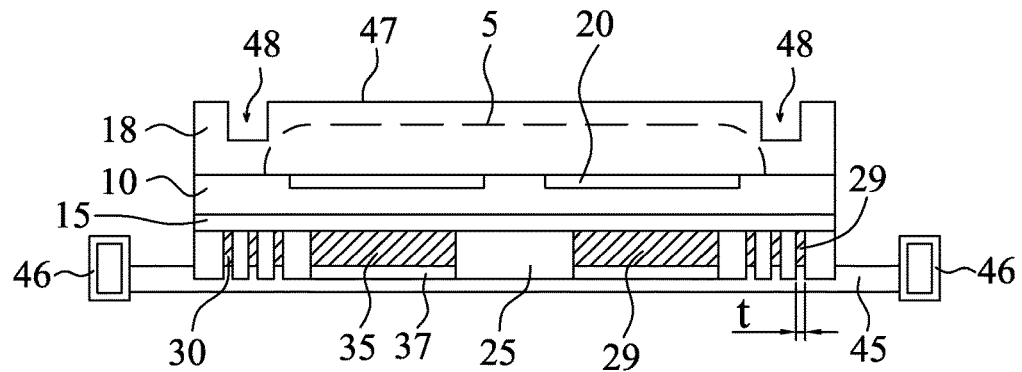
Figure 6:
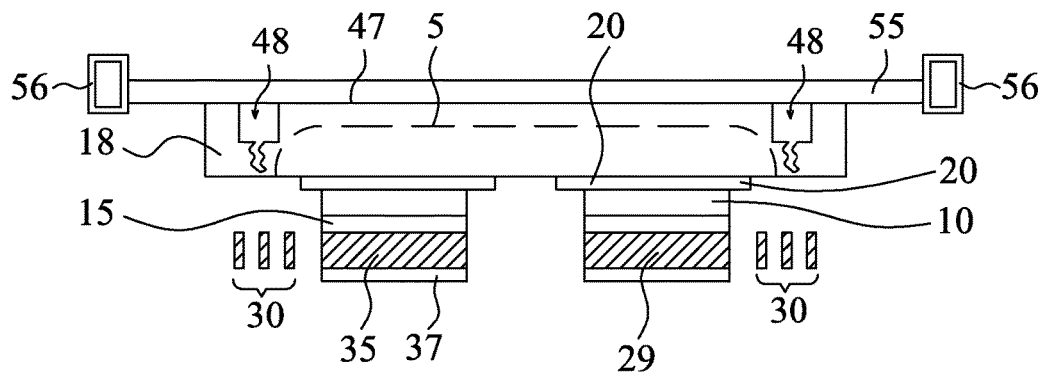
Figure 7:
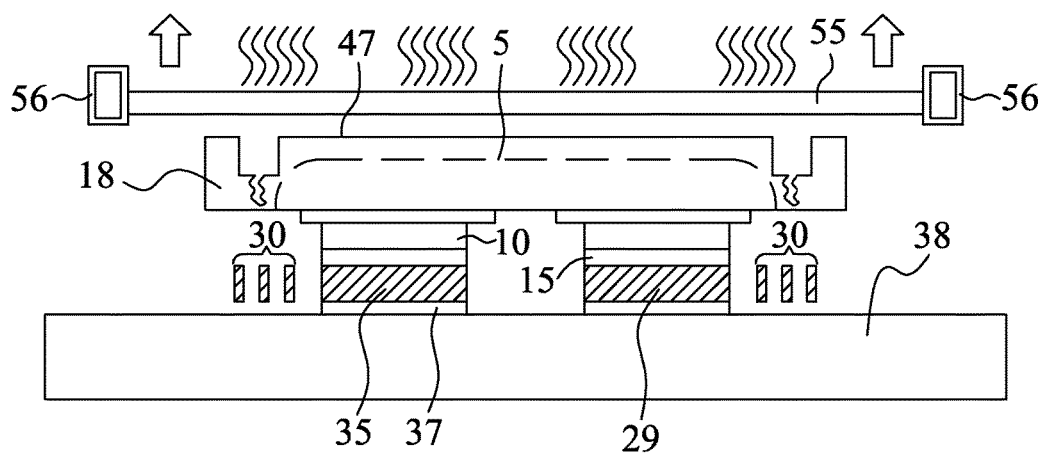

Referring to FIG. 3, the patterned photoresist layer 25 is being used as a mask and a metal material 29 such as copper (Cu) is filled into the openings 27 in the etched or patterned photoresist layer 25 to form a plurality of extendable metal wiring lines 30 via a process, which can be in the shape of springs (when viewed under a top view parallel to a top surface of the LED wafer 18). For example, to form a plurality of contacting electrodes 35 located above the bonding pads 20. A plating layer 37 can also be formed on top of the contacting electrodes 35 above the bonding pads 20. The plating layer 37 can be of copper or gold material. Referring to FIG. 4, a first tape 45 is connected to one side of the patterned photoresist layer 25, which is adjacent to the bonding pads 20 of the LEDs, and also adjacent to the extendable metal wiring lines 30. In this embodiment, the first tape 45 is treated as a carrier, and the first tape 45 is a flexible, stretchable and translucent plastic material with an adhesive layer coated on one side. A ring 46 connected to the first tape 45 is a portion of a carrier (not shown in the figure), such as a circular brace, which supports the first tape 45 during the following processes. With the support of the carrier, the soft first tape 45 can be constrained in a fixed geometry and be expanded at a steady manner. Moreover, the ring 46 can be used to keep structures to firmly dwell on the first tape 45 and constrain the first tape 45 at a same position during the following manufacturing processes. Referring to FIG. 5, a plurality of scribing lines 48 are formed at the sides adjacent to the LED chips 5 on another surface 47 of the LED wafer 18. These may be used to separate and break off of the LED chips 5. Referring to FIG. 6, the LED chips 5 are broken off along the scribing lines 48, while the first tape 45 remains bonded to the LED chip 5 during the breaking-off step. After the breaking-off step, the first tape 45 can be removed. Thereafter, a second tape 55 is bonded to another surface 47 of the LED wafer 18, and then the first tape 45 is removed. In this embodiment, a ring 56 is a portion of a carrier which supports the second tape 55. As mentioned above, the ring 56 can be used to keep the structures firmly dwell on the second tape 57 and constrain the second tape 56 at a specific position in the following manufacturing steps. The patterned photoresist layer 25 is removed by wet stripping (solvent or acid) or plasma gas stripping. The metal layer (Ti/Cu) 10, 15 connected to the LED wafer 18 is selectively etched. Therefore, a portion of the copper metal layer 29 remains as a part of the spring or extendable metal wiring lines 30 and as the contacting electrodes 35, with the un-etched titanium layer 10 bonded to the contacting electrode 35. After the selective etching of the titanium metal layer 10 by wet etching with etching solution that can etch titanium without etching copper, a pattern of a plurality of extendable metal wiring lines 30 connecting to a plurality of LED chip 5 is formed (from the remaining left-over portion of the original copper metal layer after selective etching), in which adjacent LED chips 5 are connected to each other by means of the extendable metal wiring lines 30, respectively. The fabrication steps that have taken place in this embodiment from FIG. 2 to FIG. 6 can be regarded as the MEMS fabrication steps. Referring to FIG. 7, the contacting electrode 35 is connected or mounted to an expanding table 38, while the second tape 55 is being removed by applying heat or UV radiation. The expanding table 38 is a fabricated metal assembly comprising of multiple translation stages (x, y, z, radial), which has a center expansion area (not shown) for holding the LED wafer 18. The size of the center expansion area of the expanding table 38 is dependent upon the wafer size. The expanding table 38 further includes a plurality of extending arms (not shown) configured at predetermined intervals surrounding the center expansion area for extending the sides of the LED wafer 18.

Because the LED chips 5 are already detached and broken off along the scribing lines 48, the LED chips 5 can be further separated by extending the second tape 55 to a desired length and width for mounting the LED chips 5 onto various types of desired substrates. Meanwhile, since the extendable metal wiring lines 30 has a spring-like structure arranged in a substantially parallel direction while in a contracted state, the extended connecting LED chips 5 maintain to be electrically connected to each other in the extended state of the extendable metal wiring lines 30. The extendable metal wiring line 30 can be functional as an electrically conductive wire in either an extended/expanding state or the contracted/shortened state. A large number of extendable metal wiring lines 30 can be fabricated to one wafer arranged and configured in a specific pattern for connecting to large number of LED chips 5, such as, i.e. 96000 LED chips on one 6-inch wafer, at the same time. Because of the extendable physical property of the extendable metal wiring lines 30, the distance between each pair of connected LED chips 5 can be varied and increased to a preset width to allow for or accommodate flexibility in placement and mounting of the LED chips 5 without having to worry about the extendable metal wiring lines 30 being too short or become entangled.

Figure 8:
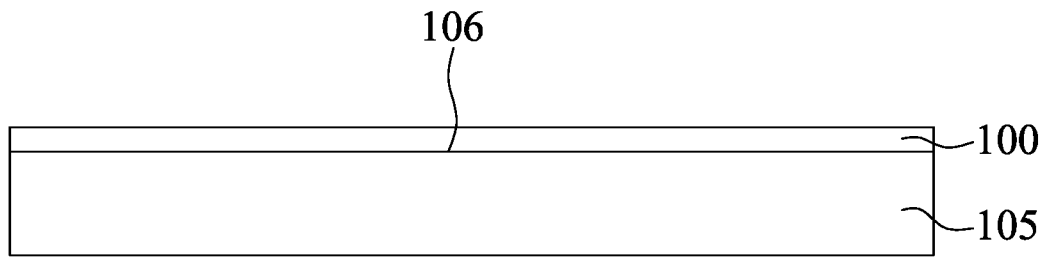
FIGS. 8-15 illustrate a plurality of schematic cross-sectional views of an integrated fabrication method according to a second embodiment of present invention.
Figure 9:
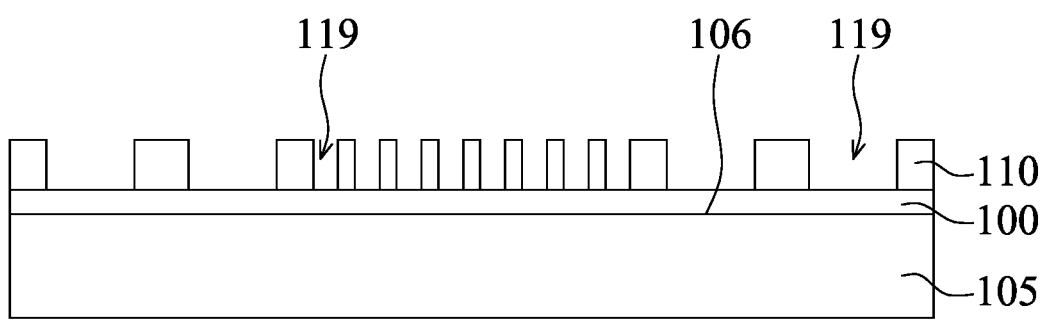
Figure 10:
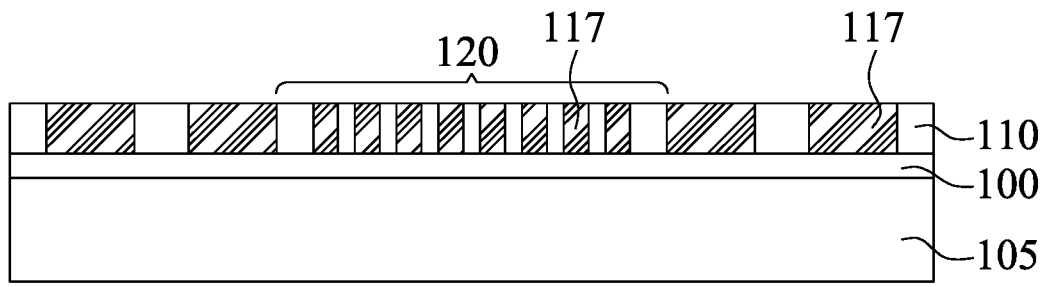
Figure 11:
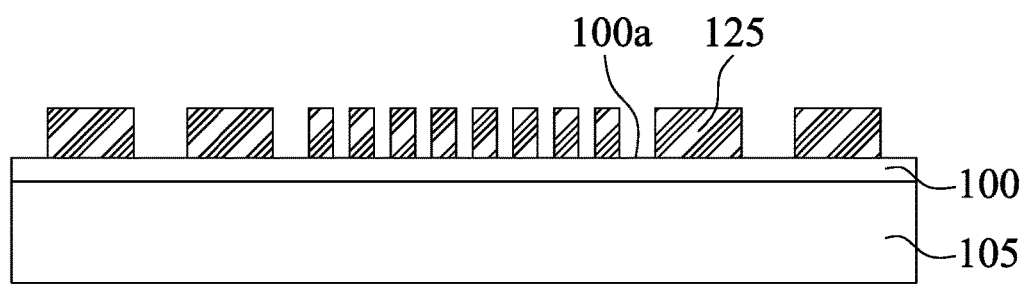
Figure 12:
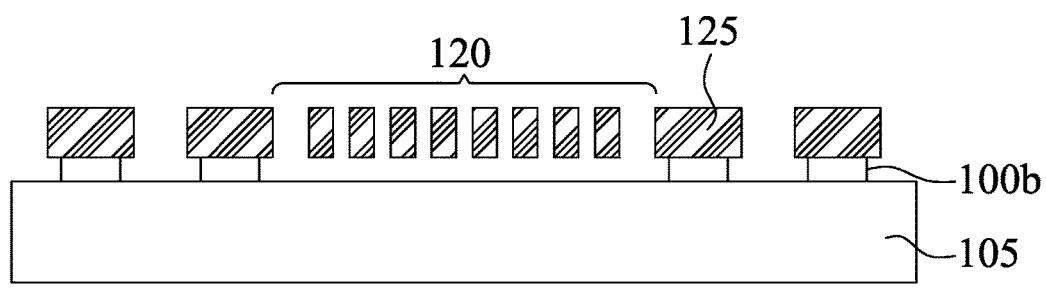
Figure 13:
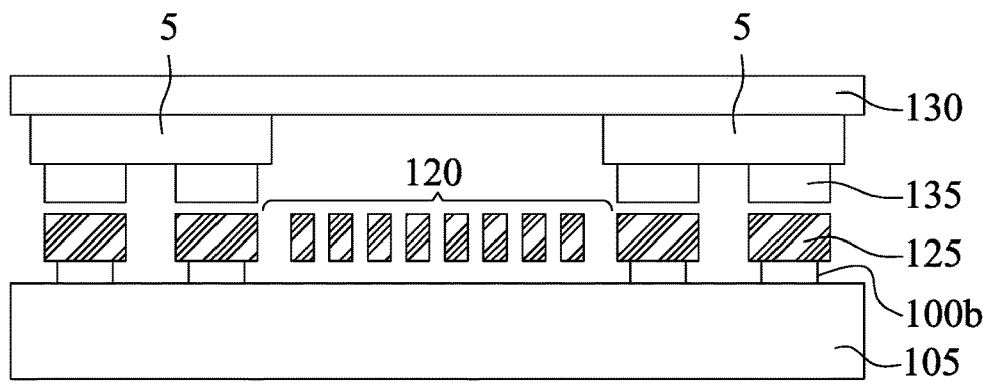
Figure 14:
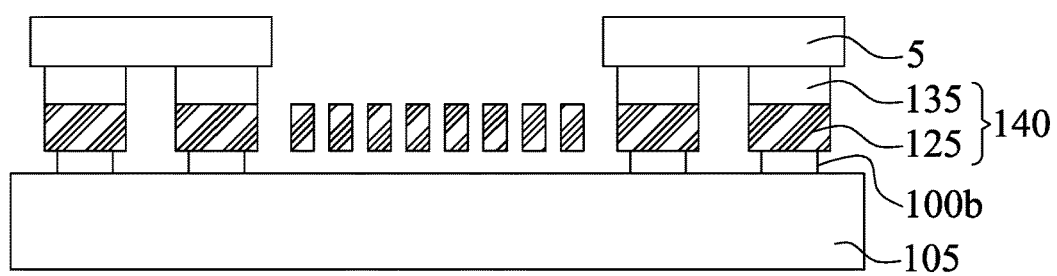
Figure 15:
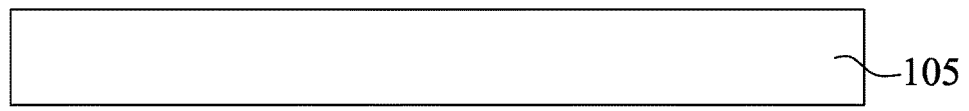

An integrated fabrication method for mounting and electrically connecting a plurality of LED chips according to a second embodiment of present invention is described as follow: as shown in FIG. 8, a metal seed layer 100 is formed on one side 106 of a template substrate 105. The metal seed layer 100 comprises titanium. The metal seed layer 100 can be deposited by an e-gun evaporation. As shown in FIG. 9, a photoresist layer 110 is formed to cover the top of the metal seed layer 100, and the photoresist layer 110 can be a positive resist or a negative resist and is then etched or exposed/developed to serve as a mask. As shown in FIG. 10, using the patterned photoresist layer 110 as the mask, the metal layer 117, comprising copper (Cu), is filled into the openings 119 of the patterned photoresist layer 110 to form a plurality of extendable metal wiring lines 120, which can be in the shape of springs, and also to form a plurality of contacting electrodes 125. The extendable metal wiring lines 120 form a predefined pattern (not shown in the figure) which covers the template substrate 105. Each extendable metal wiring line 120 is connected to a pair of adjacent contacting electrodes 125 at two ends thereof. As shown in FIGS. 11-12, the patterned photoresist layer 110 is removed by a process, such as wet stripping (solvent or acid) or plasma gas stripping, and selective etching is performed to remove the metal seed layer 100 so that the extendable metal wiring line 120 electrically connecting the contacting electrodes 125 remains above the template substrate 105. That is, a portion of the metal seed layer 100a located below the extendable metal wiring line 120 is substantially removed by the selective etching, while the portion of the metal seed layer 100b beneath the contacting electrode 125 remains. The fabrication steps that have taken place in this embodiment from FIG. 9 to FIG. 12 can be regarded as the MEMS fabrication steps. As shown in FIG. 13, a first tape 130 is connected to one side of a plurality of LED chips 5, where each of the LED chips 5 has a pair of contact pads 135. The pair of contact pads 135 of each LED chip 5 bonded to the first tape 130 are aligned with respect to the pair of contacting electrodes 125 (bonded to the template substrate 105) which was formed as shown in FIG. 10. As shown in FIG. 14, the contact pads 135 are bonded with the corresponding contacting electrodes 125 at one side and connected to the corresponding portion of the metal seed layer 100b at the other side. The first tape 130 is removed from the LED chips 5 to form an intermediate LED chip assembly 140. As shown in FIG. 15, the intermediate LED chip assembly 140 along with the LED chip 5 are connected to a final substrate 145 to be a chip on glass (COG) or chip on board (COB) structure, while removing the template substrate 105 from the intermediate LED chip assembly 140 by procedures such as heating, providing UV light, or using organic solvent. The COG structure comprises a glass substrate or a transparent substrate as a support, and the COB structure comprises a PCB board as a support.

Figure 16:
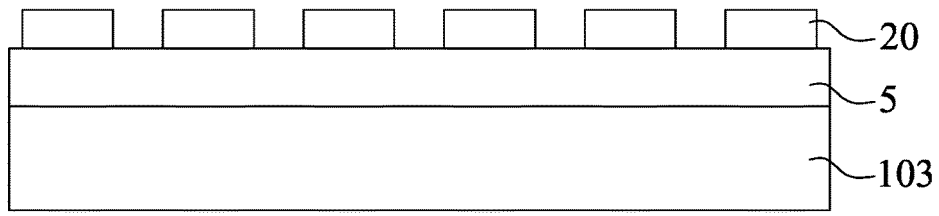
FIGS. 16-22 illustrate a plurality of schematic cross-sectional views of an integrated fabrication method according to a third embodiment of present invention.
Figure 17:
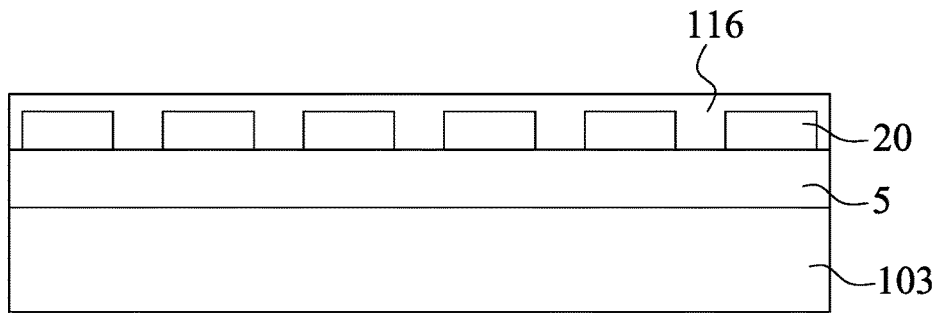
Figure 18:
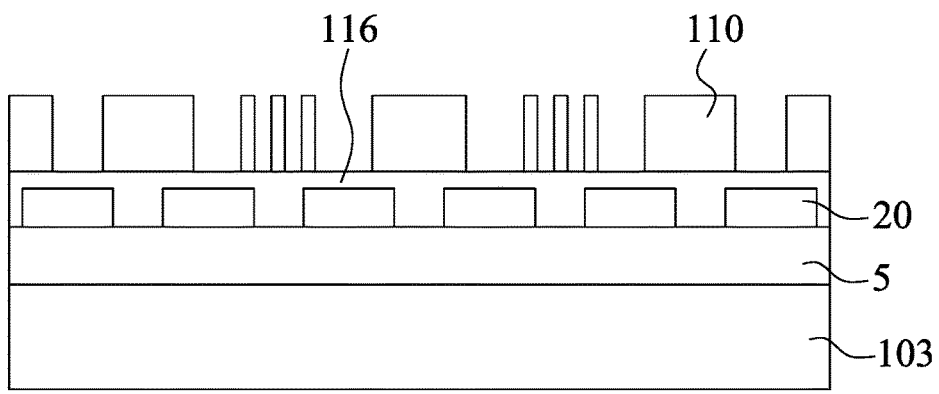
Figure 19:
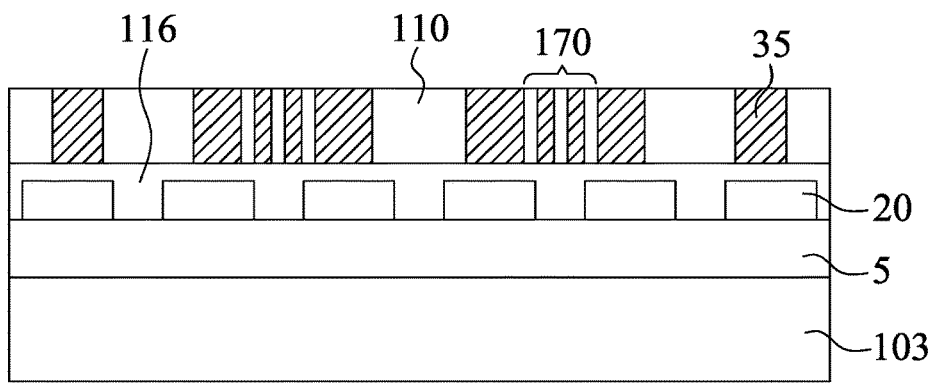
Figure 20:
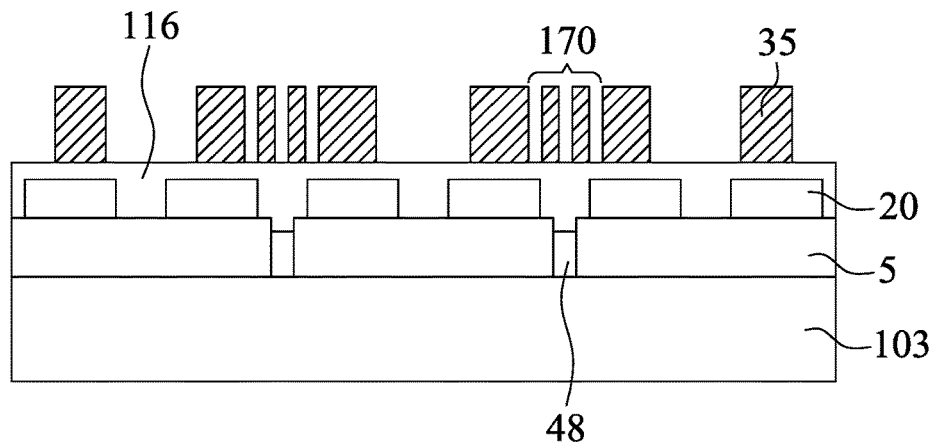
Figure 21:
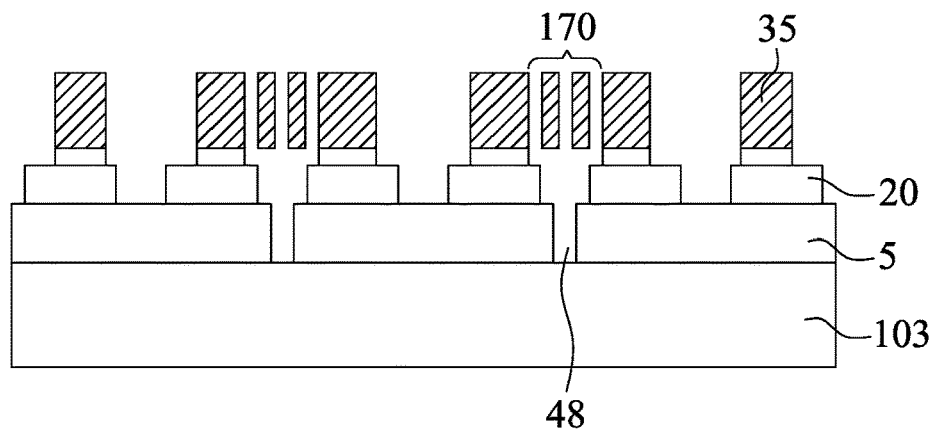
Figure 22:
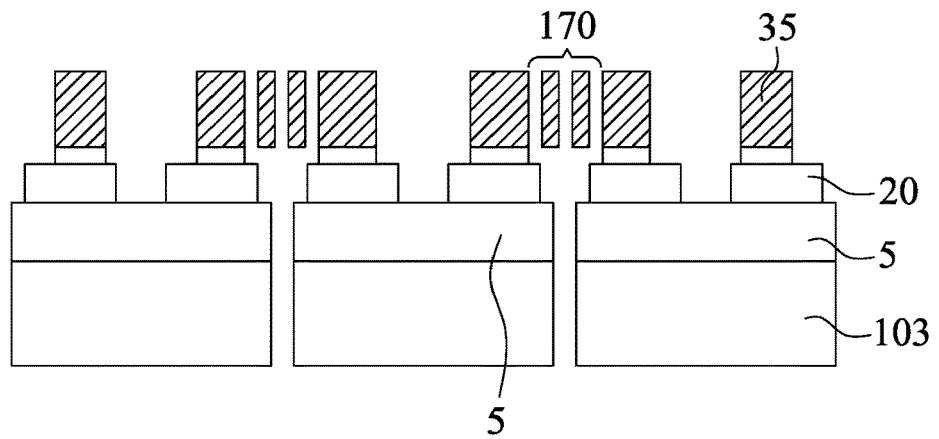

An integrated fabrication method for electrically connecting a plurality of LED chips according to a third embodiment of present invention is described. As shown in FIG. 16, an LED chip 5 and a plurality of bonding pads 20, made of material such as copper, are formed on one surface of a substrate 103. As shown in FIG. 17, a metal layer 116 is deposited by a process, such as e-gun evaporation, to cover the LED chips 5 and the bonding pads 20. As shown in FIG. 18, a photoresist layer 110 is formed to cover the top of the metal layer 116. The photoresist layer 110 is then etched or patterned to serve as a mask. As shown in FIG. 19, the etched or patterned photoresist layer 110 is used as the mask, and a metal material such as copper (Cu) is filled into the openings of the patterned photoresist layer 110 to form a plurality of extendable metal wiring lines 170. The extendable wiring lines 170 can be in the form of a short wire having a spring shape, as well as to form the contacting electrodes 35 located above the bonding pads 20 of the LED chips 5, located above the substrate 103. As shown in FIG. 20, the patterned photoresist layer 110 is removed by methods such as wet stripping (solvent or acid) or plasma gas stripping and a plurality of scribing lines 48 are formed above the substrate 103 by a process comprising using deep scribing laser. As shown in FIG. 21, the metal layer 116 is removed by selective etching to preserve a portion of the metal layer 116 which is connected between the bonding pads 20 and the contacting electrodes 35. The bonding pads 20 connected to the LED chip 5 are left. The metal layer left is further used as a spring structure for the extendable metal wiring lines 170 and the contacting electrodes 35. After the selective etching of the titanium metal layer, a pattern of the extendable metal wiring lines 170 connecting the LED chips 5 is formed from the copper metal layer, in which adjacent LED chips 5 are connected to each other by the extendable metal wiring lines 170, respectively. The metal layer located below the extendable metal wiring line 170 is substantially removed by the performed selective etching. As shown in FIG. 22, with the LED chips 5 being already-detached along the scribing lines 48, the substrate 103 with separated individual LED chips 5 formed thereon are further scored or scribed and separated thereby forming scribed substrate pieces. So that, a plurality of LED chip assemblies have the pattern of the extendable metal wiring lines 170 connecting adjacent LED chips 5.

Figure 23:
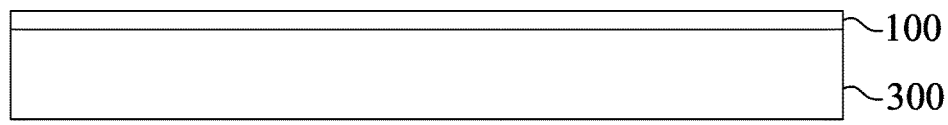
FIGS. 23-31 illustrate a plurality of schematic cross-sectional views of an integrated fabrication method according to a fourth embodiment of present invention.
Figure 24:
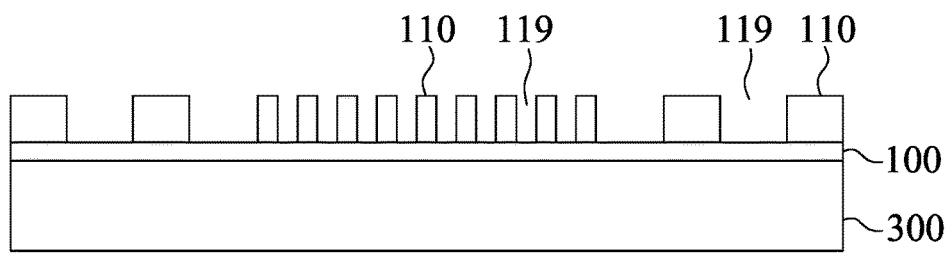
Figure 25:
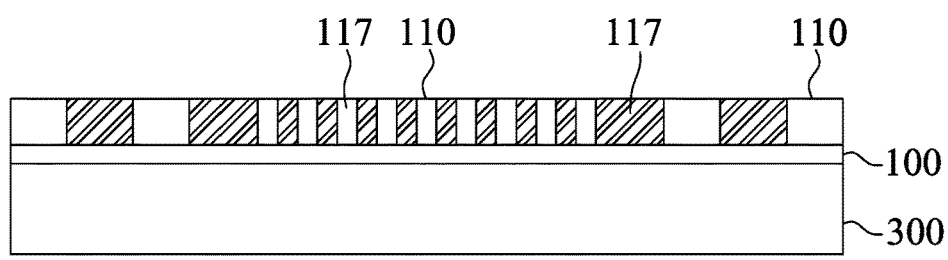
Figure 26:
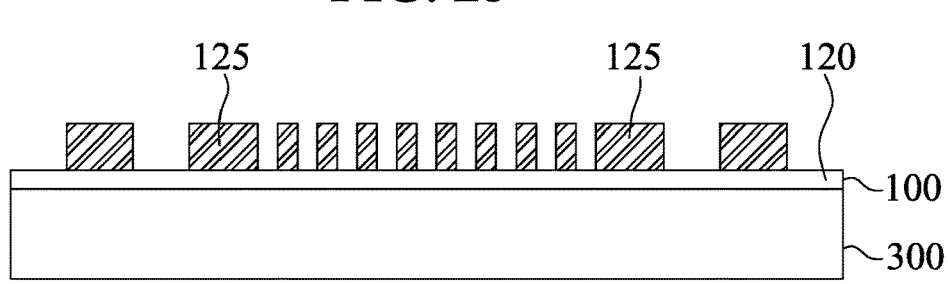
Figure 27:
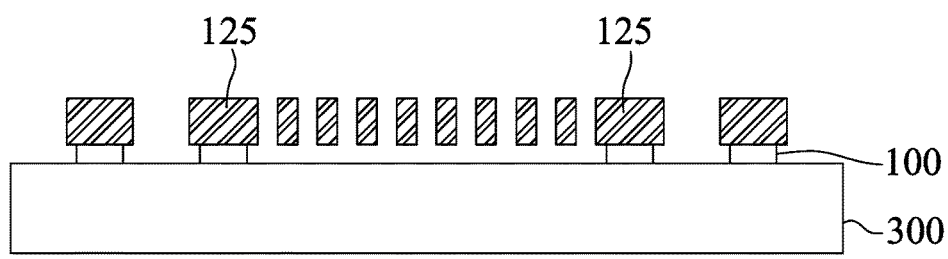
Figure 28:
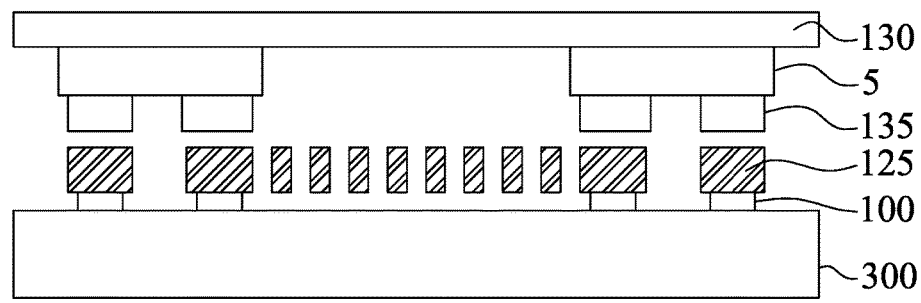
Figure 29:
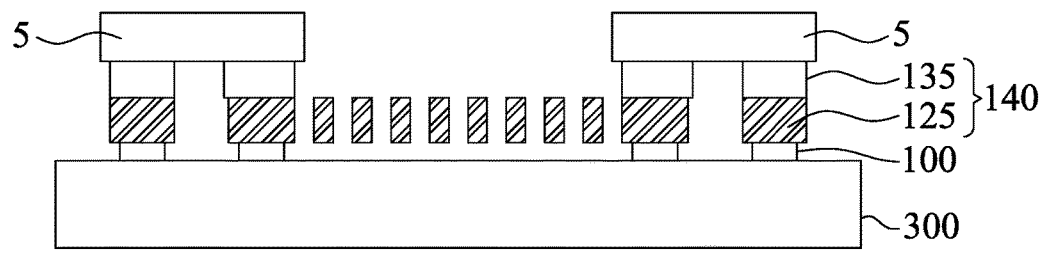
Figure 30:
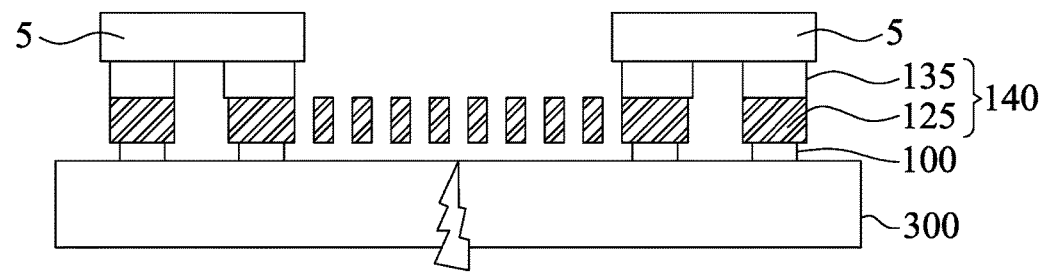
Figure 31:
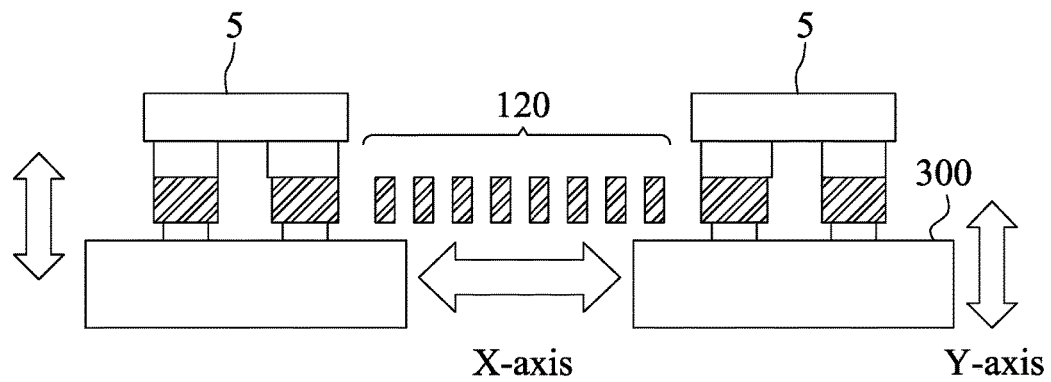

An integrated fabrication method for electrically connecting a plurality of LED chips to a substrate according to a fourth embodiment of present invention is described. As shown in FIG. 23, a metal seed layer 100 is formed on one side of a transparent substrate 300. The metal seed layer 100 can be deposited by e-gun evaporation. As shown in FIG. 24, a photoresist layer 110 is formed to cover the top of the metal seed layer 100 and the photoresist layer 110 is then etched or patterned to serve as a mask. As shown in FIG. 25, using the patterned photoresist layer 110 as the mask, metal material, such as copper is filled into the openings 119 of the patterned photoresist layer 110 to form a plurality extendable metal wiring lines 120. The plurality extendable metal wiring lines 120 can be in the shape of springs. Metal material 117, comprising copper, is filled into the openings 119 to form a plurality of contacting electrodes 125. The extendable metal wiring lines 120 form a predefined pattern covering the transparent substrate 300. Each extendable metal wiring line 120 is connected to a pair of adjacent contacting electrodes 125 at both ends thereof, respectively. As shown in FIG. 26, the photoresist layer 110 is removed by methods comprising wet stripping (solvent or acid) or plasma gas stripping, so that, the metal which fills in the openings to form the extendable metal wiring lines 120 and the contacting electrodes 125 remain. Each extendable metal wiring line 120 is connected to a pair of adjacent contacting electrodes 125. In addition, a pattern of the extendable metal wiring lines 120 connecting the contacting electrodes 125 is formed on the transparent substrate 300. As shown in FIG. 27, selective etching is performed to remove the metal seed layer 100 so that the extendable metal wiring line 120 connecting the contacting electrodes 125 remain above the transparent substrate 300. The metal seed layer 100 located below the extendable metal wiring line 120 is substantially removed by the selective etching. The fabrication steps that have taken place in this embodiment from FIG. 24 to FIG. 27 can be regarded as the MEMS fabrication steps. As shown in FIG. 28, a first tape 130 is bonded to one side of a plurality of LED chips 5, where the LED chips 5 each has a pair of contact pads 135. The contact pads 135 of each LED chip 5 bonded to the first tape 130 are aligned with respect to the contacting electrodes 125 (bonded to the transparent substrate) formed as shown in FIG. 28. As shown in FIG. 29, the contact pads 135 are bonded with the corresponding contacting electrodes 125. The first tape 130 is removed from the LED chips 5 to form an intermediate LED chip assembly 140. As shown in FIG. 30, the transparent substrate 300 is cut and broken off. As shown in FIG. 31, the LED chips 5 connected by the extendable metal wiring lines 120 are both movable and/or expandable in a vertical direction (along y-axis), and in a horizontal direction (along x-axis) thereby allowing convenient usage for a construction comprising the individual LED chips 5 and connected individual pieces of the transparent substrate 300 connected to the flexible substrate (not shown).

Figure 32:
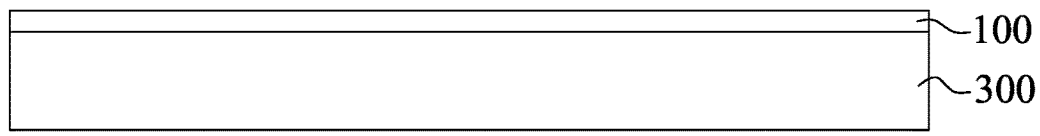
FIGS. 32-38b illustrate a plurality of schematic cross-sectional views of an integrated fabrication method according to a fifth embodiment of present invention.
Figure 33:
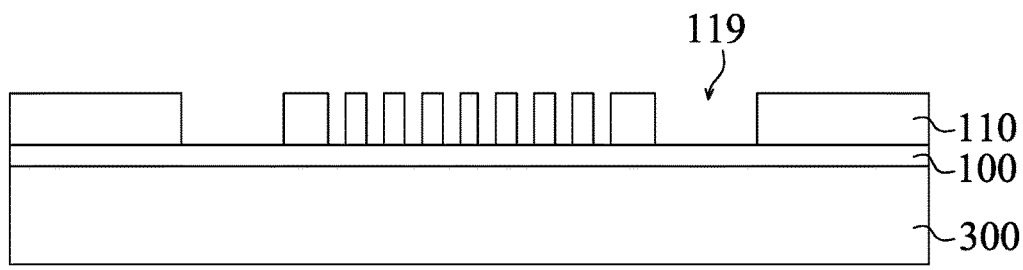
Figure 34:
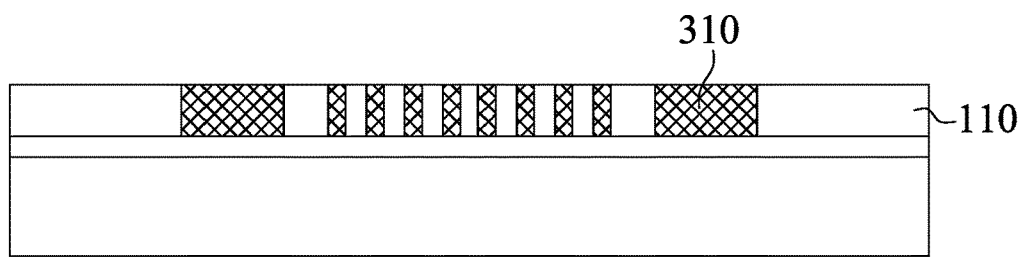
Figure 35:
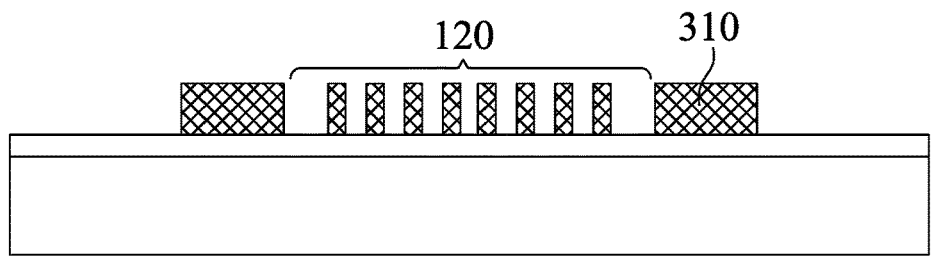
Figure 36:
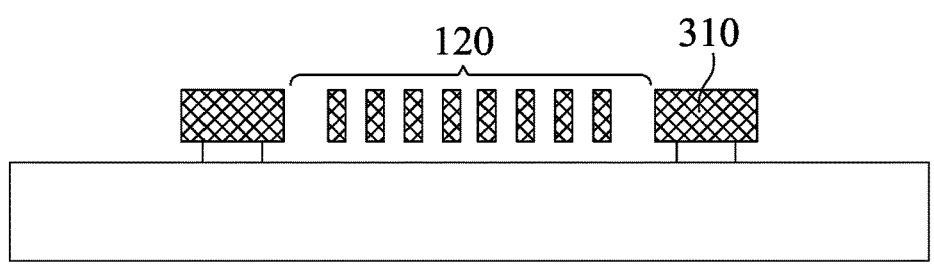
Figure 37:
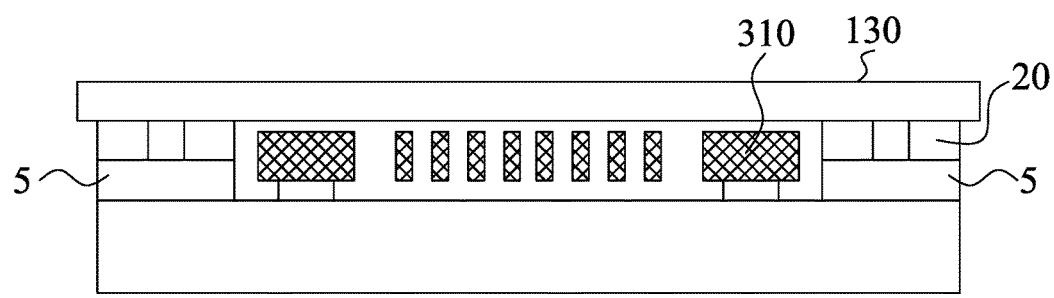

An integrated fabrication method for electrically connecting a plurality of LED chips according to a fifth embodiment of present invention is described here. As shown in FIG. 32, a metal seed layer 100 is formed on one side of the transparent substrate 300. The metal seed layer 100 can be deposited by e-gun evaporation. As shown in FIG. 33, a photoresist layer 110 is formed to cover the metal seed layer 100. The photoresist layer 110 is then etched to serve as a mask. As shown in FIG. 34, using the etched photoresist layer 110 as the mask, metal material, comprising copper, is filled into the openings 119 of the etched photoresist layer 110 to form a plurality of extendable metal wiring lines 120 and a plurality of bonding terminals 310. The extendable metal wiring lines 120 can be in the shape of springs. The extendable metal wiring lines 120 form a predefined pattern covering an area such as that of the transparent substrate 300. Each extendable metal wiring line 120 is connected to a pair of adjacent bonding terminals 310 at both ends thereof, respectively. As shown in FIG. 35, the etched photoresist layer 110 is removed by process comprising wet stripping with solvent or acid applied and plasma gas stripping, but the metal forming the extendable metal wiring lines 120, and the bonding terminals 310 remain. Each extendable metal wiring line 120 is connected to a pair of adjacent bonding terminals 310. In addition, a pattern of the extendable metal wiring lines 120 connecting many of the bonding terminals 310 is formed on the transparent substrate 300. As shown in FIG. 36, selective etching is performed to remove the metal seed layer 100, so that the extendable metal wiring line 120 connecting the bonding terminals 310 remains above the transparent substrate 300. The metal seed layer 100 below the extendable metal wiring line 120 is substantially removed by the selective etching. The fabrication steps that have taken place in this embodiment from FIG. 33 to FIG. 36 can be regarded as the MEMS fabrication steps. As shown in FIG. 37, a plurality of LED chips 5 are formed on a first tape 130 through the bonding pads 20 of the LED chips 5. Then the first tape 130 and LED chips 5 formed thereon are connected to the transparent substrate 300 by procedures such as heating, providing UV light, or using organic solvent. Wherein, the bonding terminals 310 and the extendable metal wiring lines 120 can be optionally attached to the first tape 130.

Figure 38A:
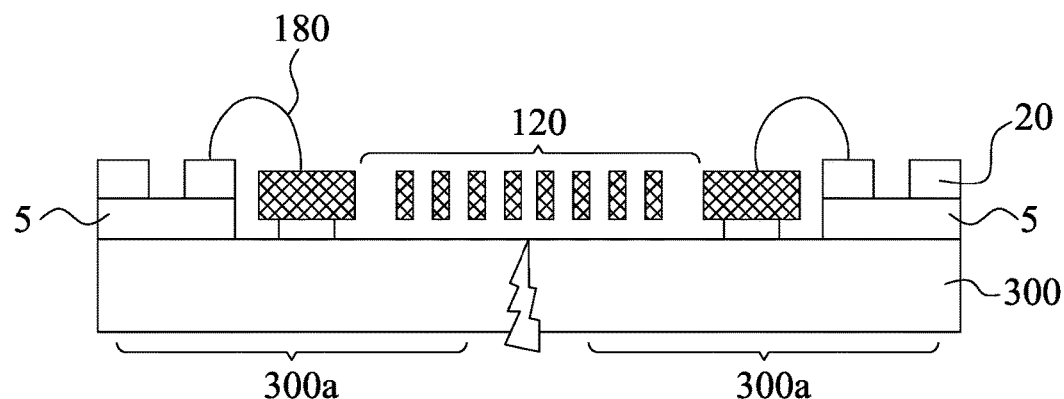
Figure 38B:
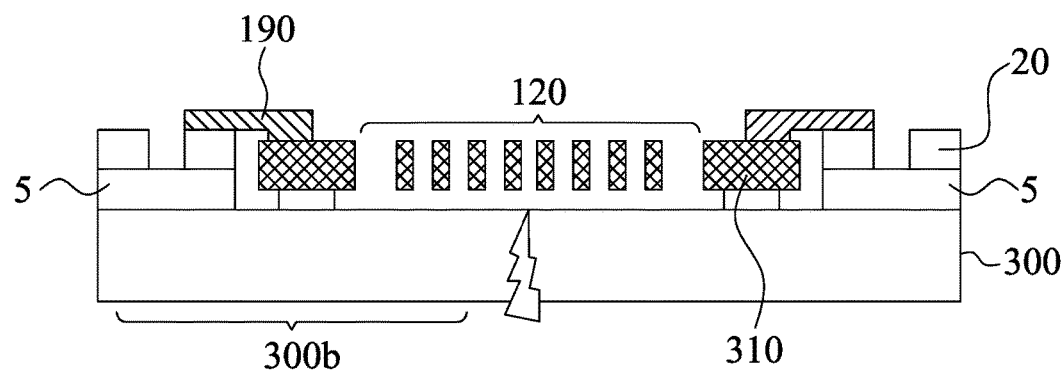
Figure 39:
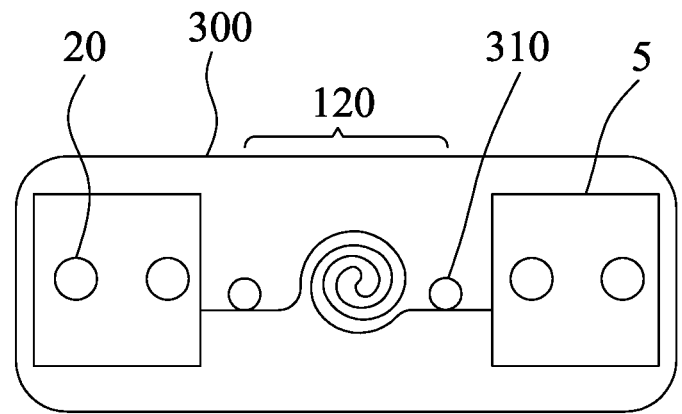
FIG. 39 is a top view diagram illustrating the LED chips placed on the transparent substrate and the spring structure of the extendable metal wiring line connecting adjacent bonding terminals shown in FIG. 37 according to the fifth embodiment of present invention.

According to the fifth embodiment, either the wire bonding structure 180 as shown in FIG. 38a or the metallization structure 190 as shown in FIG. 38b can be adopted to form an electrical path connecting to external power supply or other LED chip 5. As shown in FIG. 38a, the transparent substrate 300 is cut and broken up into a plurality of individual transparent substrate pieces 300a wherein each piece 300a holds one LED chip 5. An electrical connection is made using wire bonding from the bonding terminal 310 to one of the bonding pads 20 of the LED chip 5. Meanwhile, the bonding terminals 310 and the extendable metal wiring line 120 formed in the steps depicted in FIG. 34 and FIG. 35 are electrically connected each other. As shown in FIG. 38b, the transparent substrate 300 is cut and broken up into a plurality of individual transparent substrate pieces 300b wherein each piece 300b holds/comprises one LED chip 5. Using lithography and metallization technology, an electrical connection is made from the bonding terminal 310 to one of the bonding pad 20 of the LED chip 5. Meanwhile, the bonding terminals 310 and the extendable metal wiring line 120 formed in the steps depicted in FIG. 34 and FIG. 35 are electrically connected each other. As shown in FIG. 39, a top view diagram illustrating the placement of the LED chips 5 on the transparent substrate 300 and the spring structure of the extendable metal wiring line 120 connecting adjacent bonding terminals 310 shown in FIG. 37 according to the fifth embodiment of present invention.

In the illustrated embodiments, including first to fifth embodiments, the thickness t (as shown for example in FIG. 3 of the first embodiment) of the extendable metal wiring lines can be between 0 microns to 100 microns. In another embodiment, the thickness t is less than 70 microns.

As illustrated in some of the above embodiments, the tape supporting the LED chips can be either at a farther distance away from or at a close proximity/adjacent to the extendable metal wiring line. The tape used in the above embodiments can be expanded or extended in one direction or more directions. In all of the illustrated embodiments, the extendable metal wiring line can be suspended. In the embodiments, the tape is made by a thin film layer (not shown) coated by an adhesive layer (not shown). The adhesive layer is made of acrylic based composition. The thin film layer is made of a PVC composition. In addition, the extendable metal wiring line can be made of other metals, such as Ni, Ag, or Au.

In other alternative embodiments, the pads for the LED chip can be formed on opposite surfaces of the LED chip or on the same surface. Thus, the p-pad and the n-pad can also be on different sides of the LED chip.

Figure 40:
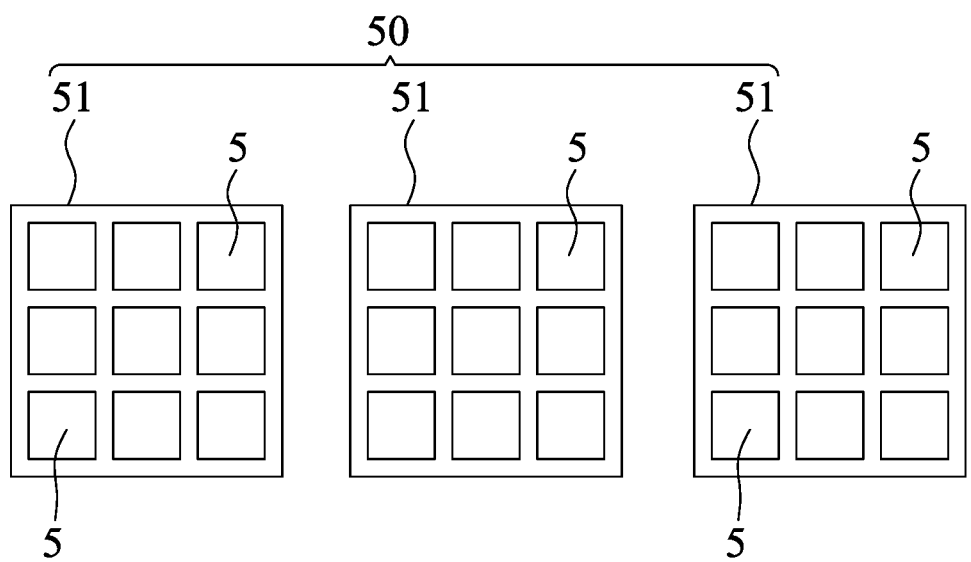
FIG. 40 shows a substrate being cut into a plurality of pieces, where each piece of the substrate includes more than one LED chip.

In one embodiment, a substrate 50 holds a plurality of LED chips 5, in which the substrate 50 can be cut into a plurality of substrate pieces 51. Each piece 51 of the substrate 50 includes more than one LED chips 5 as shown in FIG. 40. The width of the extendable metal wiring lines in the embodiments of present invention can be <70 um, such as 5 um, 10 um, 27 um, 57 um or 62 um. The length of the extendable metal wiring lines can be 255 μm when contracted, or 1200 μm when extended. Meanwhile, the contracted length of the extendable metal wiring line can be quantified as A, and the extended length of the extendable metal wiring line can be estimated to be 3.5 A to 4.0 A. The ratio t/2R of the radius of curvature (R) and the thickness (t) of the extendable metal wiring line cannot exceed the yield strain of the material of the extendable metal wiring line.

It is believed that the present embodiments and their advantages will be understood from the foregoing description, and it will be apparent that various changes may be made thereto without departing from the spirit and scope of the embodiments or sacrificing all of its material advantages.

What is claimed is:

1. An integrated fabrication method to form a light-emitting device assembly, comprising:
    forming a LED chip having a pair of contact pads;
    forming a seed layer having a first portion and a second portion, and the first portion is aligned with respect to the pair of contact pads of the LED chip;
    forming a photoresist layer with a plurality of openings;
    forming a plurality of extendable metal wiring lines and a plurality of contacting electrodes aligned with respect to the pair of contact pads of the LED chip by filling a metal material into the openings of the photoresist layer, and each of the extendable metal wiring lines being suspended and connected to a pair of adjacent contacting electrodes; and removing the second portion of the seed layer.

2. The integrated fabrication method as claimed in claim 1, wherein the extendable metal wiring lines are arranged to form a predefined pattern suspended above the plurality of LED chips.

3. The integrated fabrication method as claimed in claim 1, further comprising: mounting the LED chip onto a final substrate after the step of removing the second portion of the seed layer.

4. The integrated fabrication method as claimed in claim 3, wherein the final substrate is a glass substrate or a PCB board.

5. An integrated fabrication method to form a light-emitting device assembly, comprising:
   forming a plurality of LED chips, each of the LED chips comprising a pair of contact pads;
   forming a seed layer having a first portion and a second portion, and the first portion is aligned with respect to the pair of contact pads of each of the LED chips;
   forming a photoresist layer with a plurality of openings;
   forming a plurality of extendable metal wiring lines and a plurality of contacting electrodes aligned with respect to the pair of contact pads of each of the LED chips by filling a metal material into the openings of the photoresist layer, and each of the extendable metal wiring lines being suspended and connected to a pair of adjacent contacting electrodes;
   forming a plurality of scribing lines at the sides adjacent to the LED chips; and
   removing the second portion of the seed layer.

6. The integrated fabrication method as claimed in claim 5, wherein the extendable metal wiring lines are arranged to form a predefined pattern suspended above the LED chips.

7. The integrated fabrication method as claimed in claim 5, further comprising: mounting the LED chips onto a final substrate after the step of removing the second portion of the seed layer.

8. The integrated fabrication method as claimed in claim 7, wherein the final substrate is a glass substrate or a PCB board.

9. The integrated fabrication method as claimed in claim 5, wherein the scribing lines extend in a direction from the LED chips to the extendable metal wiring lines.

10. The integrated fabrication method as claimed in claim 5, further comprising: forming a plating layer on the contacting electrodes after the step of forming the extendable metal wiring lines and the contacting electrodes.

* * * * *